United States Patent [19]

Tomisawa et al.

[11] Patent Number: 5,025,305
[45] Date of Patent: Jun. 18, 1991

[54] SEMICONDUCTOR DEVICE FOR DETECTING OR EMITTING A MAGNETIC LINE OF FORCE OR LIGHT

[75] Inventors: Yutaka Tomisawa, Yokohama; Toshikazu Fukuda, Kawasaki; Kazuhiko Inoue, Yokohama, all of Japan

[73] Assignee: Kabushiki Kaisha Toshiba, Kawasaki, Japan

[21] Appl. No.: 517,294

[22] Filed: May 1, 1990

[30] Foreign Application Priority Data

May 18, 1989 [JP] Japan ................. 1-125311

[51] Int. Cl.[5] ................. H01L 23/28; H01L 23/02; H01L 23/12; H01L 27/14
[52] U.S. Cl. ................. 357/72; 357/30; 357/19; 357/27; 357/74; 361/392; 361/400; 361/404; 174/52.4; 174/52.5
[58] Field of Search ................. 361/392, 400, 404; 174/52.4, 52.5; 357/74, 19, 27, 30 D, 30 R, 72

[56] References Cited

U.S. PATENT DOCUMENTS

| | | | |
|---|---|---|---|
| 3,740,672 | 6/1973 | Presser | 174/52.4 |
| 4,695,678 | 9/1987 | Itagaki et al. | 174/52.4 |
| 4,945,391 | 7/1990 | Yogoura et al. | 357/19 |

OTHER PUBLICATIONS

Patent Abstracts of Japan, vol. 9, No. 181 (E-131) [1904], Jul. 26, 1985; Japanese Patent Publication No. 60-52063, dated Mar. 23, 1985, Watanabe.
Patent Abstracts of Japan, vol. 6, No. 194 (E-134)[1072], Oct. 2, 1982; Japanese Patent Publication No. 57-106185, dated Jul. 1, 1982, Tachibana.
Patent Abstracts of Japan, vol. 11, No. 325 (E-551)[2772], Oct. 22, 1987; Japanese Patent Publication No. 62-113454, dated May 25, 1987, Hattori.
IBM Technical Disclosure Bulletin, vol. 22, No. 8A, Jan. 1980; "Edge-Mounted Hall Cell Sensor", Katyl, p. 3165.
Patent Abstracts of Japan, vol. 6, No. 107 (E-113)[985], Jun. 17, 1982; Japanese Patent Publication No. 57-37889, dated Mar. 2, 1982, Nakaya.
Electronic Engineering, vol. 53, No. 657, Sep. 1981; "Trends Towards Alternative Packaging", Farrell, pp. 17-18, 20, and 22-23.

Primary Examiner—Rolf Hille
Assistant Examiner—David Ostrowski
Attorney, Agent, or Firm—Finnegan, Henderson, Farabow, Garrett and Dunner

[57] ABSTRACT

A semiconductor device for detecting or emitting a magnetic line of force or light is so provided that the major surface of its built-in semiconductor chip has a predetermined inclination angle relative to a mount surface of a mount substrate. An active layer of element for detecting a magnetic line of force or light or an element for emitting a magnetic line of force or light is formed on the major surface of the semiconductor chip. It is, therefore, possible to achieve a smaller mount thickness as defined relative to a mount surface and to detect a magnetic line of force or light coming in a direction parallel to the mount surface or to emit a magnetic line of force or light in a direction vertical to the mount surface.

10 Claims, 8 Drawing Sheets

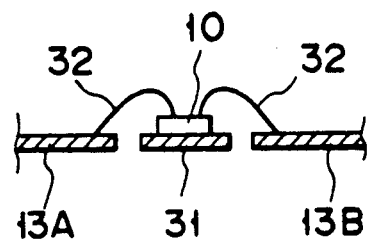
F I G. 4A
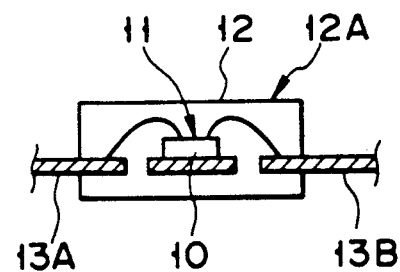
F I G. 4B
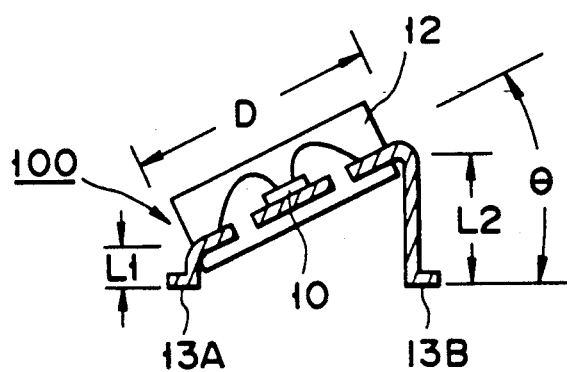
F I G. 4C

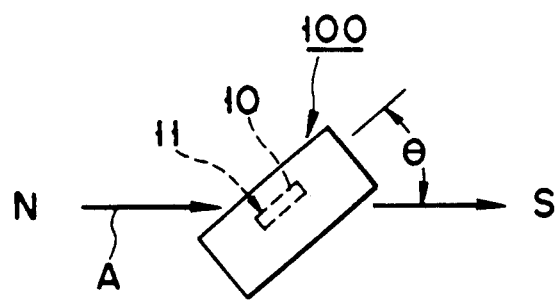
F I G. 5
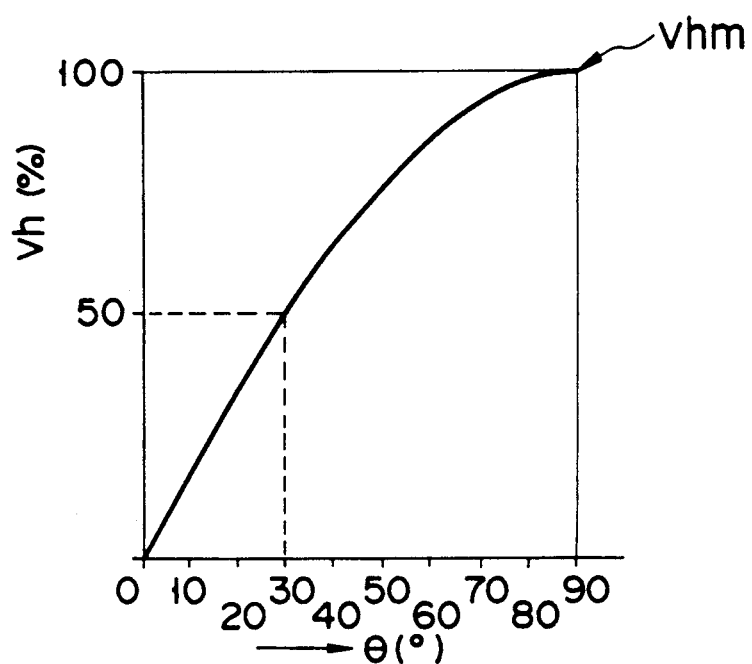
F I G. 6
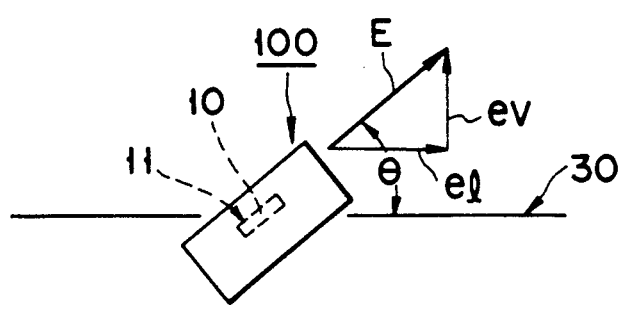
F I G. 7

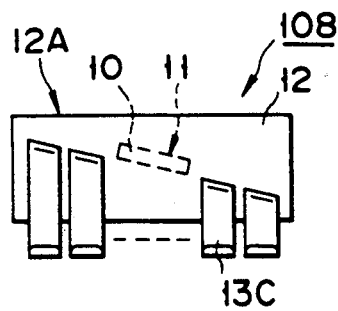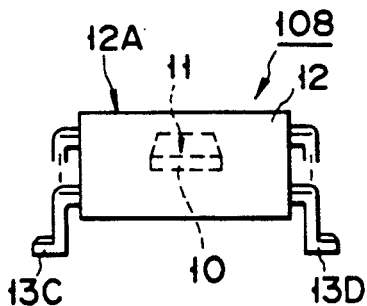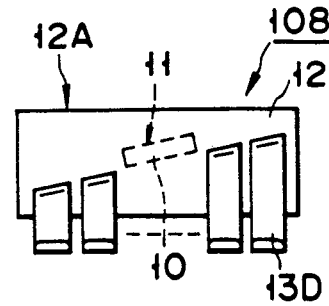
FIG. 19   FIG. 18   FIG. 20
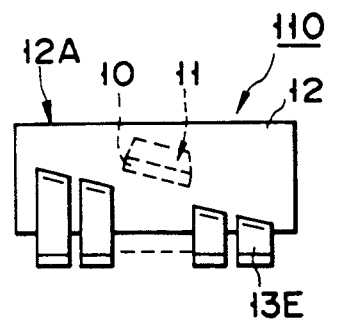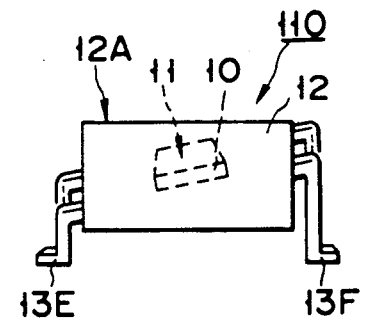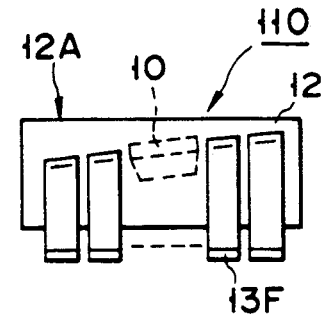
FIG. 22   FIG. 21   FIG. 23
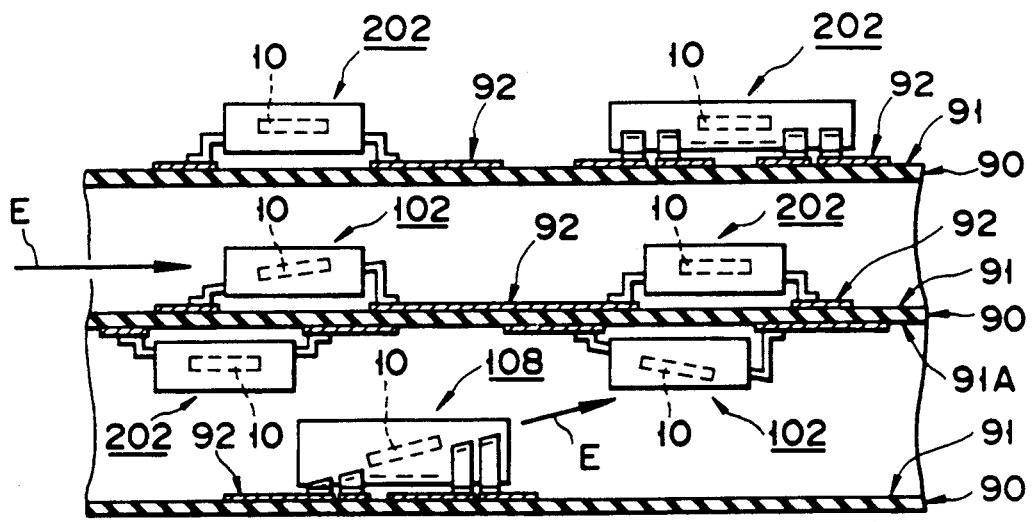
FIG. 24

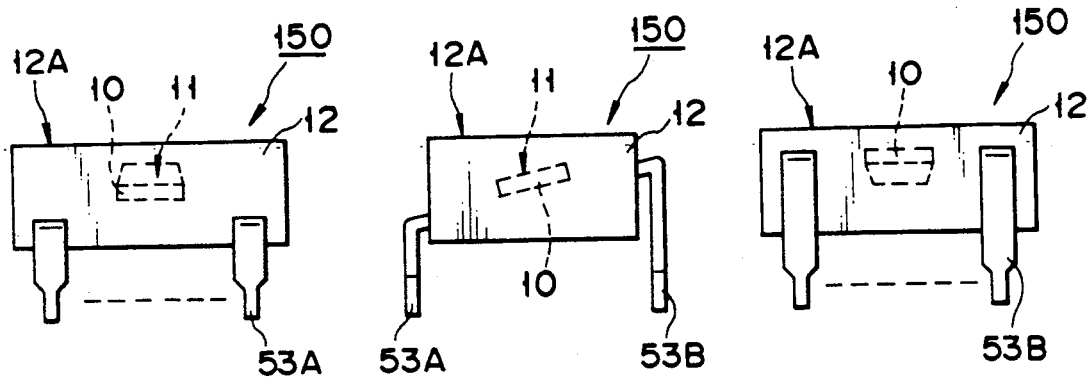
FIG. 26  FIG. 25  FIG. 27
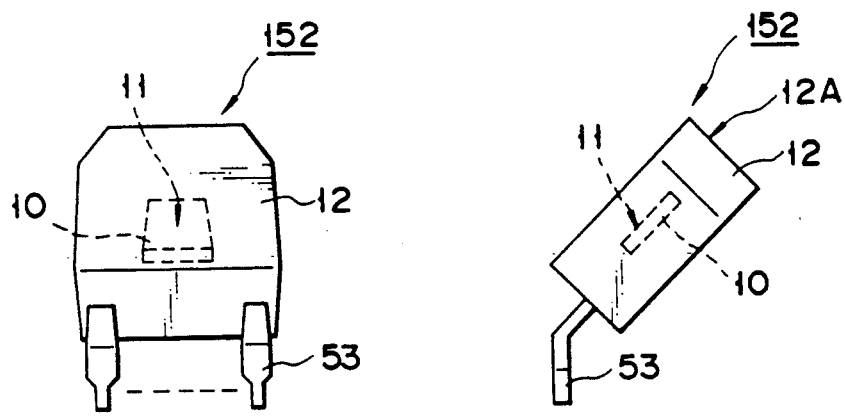
FIG. 28  FIG. 29
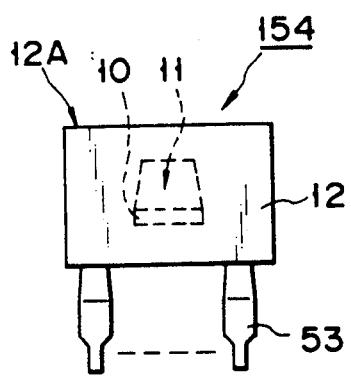 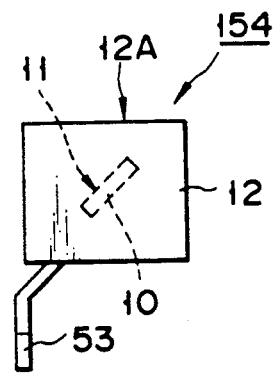
FIG. 30  FIG. 31

SEMICONDUCTOR DEVICE FOR DETECTING OR EMITTING A MAGNETIC LINE OF FORCE OR LIGHT

BACKGROUND OF THE INVENTION

1. Field of the Invention

The present invention relates to a semiconductor device having a built-in semiconductor chip with a magnetic-line-of-force- or light-detecting or -emitting element mounted thereon, such as a Hall element, a photodiode, a light emitting diode and a semiconductor laser, and to a mold for forming a package.

2. Description of the Related Art

FIGS. 1 and 2 show a conventional semiconductor device containing a semiconductor chip having an element mounted thereon to detect, for example, a magnetic line of force or light.

As shown in FIGS. 1 and 2, a semiconductor chip 80 has a magnetic-line-of-force- or light-detecting element, such as a Hall element and a photodiode, and is so sealed in a package 82 that its major surface 81 is vertically oriented with respect to a mount surface 91 of a mount substrate 90 of an electronic machinery. By the "major surface" appearing in a later description is meant a chip's surface on which is formed a magnetic-line-of-force- or light-detecting or -emitting element. External leads 83 extend from the package 82 in a direction parallel to the major surface 81 of the chip. The external lead 83 has a narrowed forward end portion inserted into a socket hole 93 of the mount substrate 90. A semiconductor device 200 thus provided is called a single in-line package type.

The semiconductor device 200 can detect, for example, a magnetic line of force A (or light) coming in a direction parallel to the mount surface 91 because the major surface 11 of the semiconductor chip 10 is oriented vertical to the mount surface 91.

However, a mount thickness H as indicated by arrows in FIGS. 1 and 2 becomes greater since the semiconductor device 200 is so configured that the major surface 81 of the chip is formed in the direction perpendicular to the mount substrate 90. It is, therefore, not possible to detect a magnetic line of force or light coming from the direction vertical to the mount surface 91.

SUMMARY OF THE INVENTION

An object of the present invention is to provide a semiconductor device having a smaller vertical mount thickness as defined relative to a mount surface, which detects a magnetic line of force or light coming in a direction parallel to the mount surface of a mount substrate and a magnetic line of force or light coming in a direction vertical to the mount surface.

Another object of the present invention is to provide a semiconductor device having a smaller vertical mount thickness as defined relative to a mount surface, which emits a magnetic line of force or light in a direction parallel to the mount surface of a mount substrate and in a direction vertical to the mount surface.

Another object of the present invention is to provide a package formation mold which is suitable to the ready manufacture of a low-cost semiconductor device.

According to the present invention, the semiconductor device includes a semiconductor device mounted on a mount surface of a mount substrate, comprising: a semiconductor chip having an active layer, on a major surface, which detects at least one of a magnetic line of force and light; at least one lead connected at one end to the semiconductor chip and at the other end to the mount substrate; and a package for sealing the semiconductor chip such that the major surface of the semiconductor chip is inclined at a predetermined angle to the mount surface.

Additional objects and advantages of the invention will be set forth in the description which follows, and in part will be obvious from the description, or may be learned by practice of the invention. The objects and advantages of the invention may be realized and obtained by means of the instrumentalities and combination particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4C are cross-sectional views showing a sequence of the manufacturing steps of the semiconductor device according to a first embodiment of the present invention;

FIG. 5 is diagram for explaining an arrival of a magnetic line of force at the semiconductor device of the first embodiment;

FIG. 6 is a characteristic curve showing a relation of the an inclination angle θ of the semiconductor chip built in the semiconductor device to an output;

FIG. 7 is a diagram for explaining the emission of a magnetic line of force at the semiconductor device o the first embodiment;

FIGS. 18 to 20, each, are a side view showing a semiconductor device according to a fifth embodiment of the present invention as viewed in a different direction;

FIGS. 21 to 23, each, are a side view showing a semiconductor device according to a sixth embodiment of the resent invention as viewed in a different direction;

FIG. 24 is a cross-sectional view showing a semiconductor device according to a seventh embodiment of the present invention;

FIGS. 25 to 27, each, are a side view showing a semiconductor device according to a eighth embodiment of the present invention as viewed in a different direction;

FIGS. 28 to 29, each, are a side view showing a semiconductor device according to a ninth embodiment of the present invention as viewed in a different direction; and FIGS. 30 to 31, each, are a side view showing a semiconductor device according to a tenth embodiment of the present invention as viewed in a different direction.

DETAILED DESCRIPTION OF THE PREFERRED EMBODIMENTS

The embodiments of the present invention will be explained below with reference to the accompanying drawings.

Embodiment 1

A semiconductor device according to a first embodiment of the present invention is a gull wing lead type device composed of a surface mounting type device (hereinafter referred to as an SMD) built-in magnetic line-of-force- or light-detecting or -emitting semiconductor chip.

Figure 3:
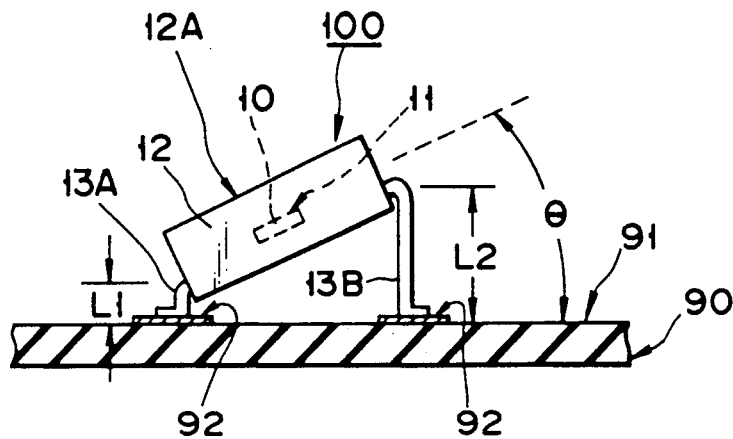
FIG. 3 is a side view showing a semiconductor device according to a first embodiment of the present invention, FIG. 3A being a perspective view showing a first semiconductor chip built in the semiconductor device, FIG. 3B being a cross-sectional view as taken along line 3B—3B in FIG. 3A, FIG. 3C being a perspective view showing a second semiconductor chip built in the semiconductor device and FIG. 3D being a cross-sectional view as taken along line 3D—3D in FIG. 3C.

As shown in FIG. 3, a magnetic-line-of-force- or light-detecting or -emitting semiconductor chip 10 is sealed in a package 12 such that its major surface 11 is located in a direction parallel to an upper surface 12A of the package 12. External leads 13A and 13B are projected from the left- and right-sides of the package 12, respectively. The external leads 13A and 13B are bent partway in the direction of a mount surface 91 and again bent in a direction parallel to the mount surface 91. The forward end portions of the external leads 13A and 13B are bonded to a conductive film pattern 92 which is formed on the mount surface 91. Such external leads are called "gull wing leads".

In FIG. 3, L1 and L2 denote the lengths of the external leads 13A and 13B, respectively, which are defined in a direction to the mount surface 91, noting that the length L1 is different from the length L2 as shown in FIG. 3. The package 12 by itself is tiltable relative to the mount surface 91. The semiconductor chip 10 is so sealed in the package 12 that the major surface 11 of the chip has an inclination angle $\theta$ with respect to the mount surface 91.

Figure 3A:
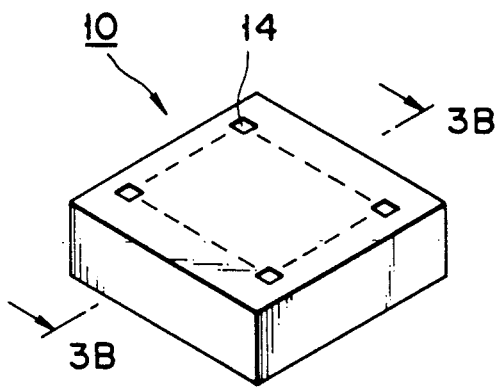

FIG. 3A is a perspective view showing one form of a built-in semiconductor chip of a semiconductor device of the present invention. FIG. 3B is a cross-sectional view as taken along line 3B—3B in FIG. 3A.

As shown in FIGS. 3A and 3B, for example, active layers of Hall element 16 for detecting a magnetic line of force is formed in, for example, a GaAs substrate 15. A surface on which is formed the active layers, such as active layers of Hall element, is called a the major surface 11. A protective film (an insulating film) 17 is formed on the GaAs substrate 15. Bonding pads 14 are locally provided on the protective film 17 and electrically connected to the active layers of Hall element 16.

The semiconductor device of the present invention contains the semiconductor chip 10 as set forth above and can detect, for example, a magnetic line of force.

Active layers of photodiode, active layers of phototransistor, active layers of photothyristor or the like may be used in place of the active layers of Hall element 16. In this case, the semiconductor chip and hence the semiconductor device detects light.

Figure 3C:
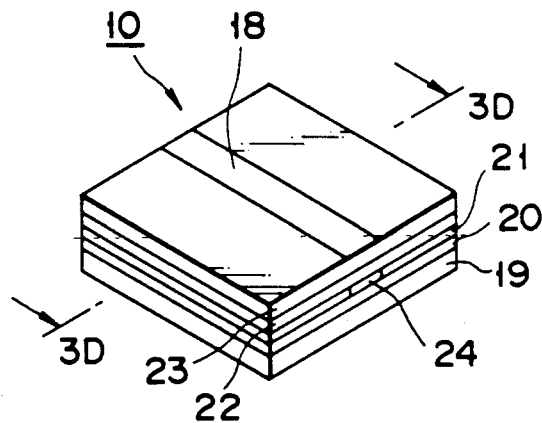
Figure 3B:
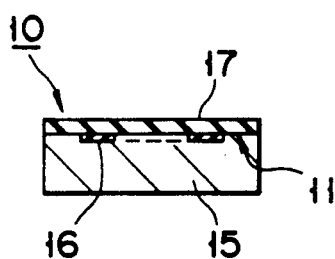
Figure 3D:
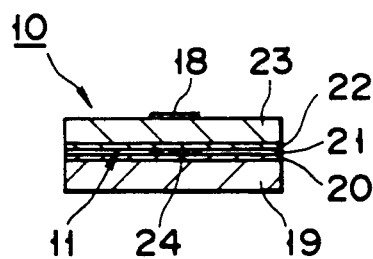

FIG. 3C is a perspective view showing a second form of a semiconductor chip of a semiconductor device of the present invention. FIG. 3D is a cross-sectional view as taken along line 3D—3D in FIG. 3C.

As shown in FIGS. 3C and 3D, a first clad layer 20 of P type InGaAlP is formed on, for example, a P type GaAs substrate 19. An active layer 21 of InGaAlP is formed on the first clad layer 20 and a second clad layer 22 of n type InGaAlP is formed on the active layer 22. A cap layer 23 of n type GaAS is formed on the second clad layer 22 and an electrode 18 is formed on the cap layer. An oscillation area (emitting area) is formed at the active layer 20 to correspond to the electrode 18. A laser beam is emitted from the oscillation area 24. A surface of the active layer 21 which forms the oscillation area 24 is called a major surface 11.

The semiconductor device of the present invention can contain the aforementioned semiconductor chip 10 and, for example, emit light.

Not only a semiconductor laser but also a light emitting diode and a laser diode for instance may be employed to emit light from the semiconductor chip.

A method for manufacturing a semiconductor device according to one embodiment of the present invention will be explained below with reference to FIGS. 4A to 4C.

As shown in FIG. 4A, a semiconductor chip 10 manufactured by an ordinary manufacturing method with a magnetic-line-of-force- or light-detecting or -emitting element formed thereon is prepared. Then the semiconductor chip 10 is bonded to a bed 31 of a lead frame—a die bonding step. A bonding pad, for instance, not shown, on the semiconductor chip 10 is electrically connected by wires 32 to corresponding external leads 13A and 13B of the lead frame—a wire bonding step.

Then a package 12 for sealing the semiconductor chip 10 and portions of the external leads 13A and 12B, together with the wires, is formed, as shown in FIG. 4B, with the use of a corresponding package formation mold. As the mold, use may be made of an ordinary mold which is used in the manufacture of an ordinary semiconductor device. In this case, a package 12 is molded by pouring insulating resin, such as synthetic resin, into the mold. At that time, a sealing packaging step is carried out with the major surface 11 of the semiconductor chip 10 situated parallel to the upper surface 12A of the package 12 in which case the external leads 13A and 13B are projected from the corresponding positions at each side of the package.

The external leads 13A and 13B are cut away from the lead frame in a manner to have respective lengths. Then the external leads 13A and 13B are bent partway in a direction of the bottom of the package 12 and then bent in the outer direction of the package 12. At this time, the external leads 13A and 13B are made to have different lengths upon being bent in the direction vertical to the aforementioned bottom direction (the mount direction). In the embodiment shown in FIG. 4, the external leads 13A and 13B are made to have lengths L1 and L2, respectively, and a relation L1 < L2.

As shown in FIG. 4C, with 1.5 mm representing a dimension D between the external leads 13A and 13B extending from both the sides of the package 12 and 0.87 mm representing a difference (L2−L1) between the vertical portions of the external leads 13A and 13B, the major surface 11 of the semiconductor chip 10 can be made at an inclination angle of about 30° relative to the mount surface of the mount substrate (90 in FIG. 3) of the electronic device. By so doing, the major surface 11 of the chip 10 has an inclination angle $\theta$ to the mount surface of the mount substrate.

The manner of detecting a magnetic line of force or emitting light on the semiconductor device 100 of the present embodiment will be explained below with reference to FIGS. 5 to 7.

FIG. 5 is a diagram showing the manner in which a magnetic line of force reaches of the aforementioned chip 10 of the first embodiment. FIG. 6 is a characteristic curve showing a relation of the inclination angle of the chip built in the semiconductor device of the first embodiment to an output obtained.

Let it be assumed that, in FIG. 5, the magnetism A acts parallel to the mount surface, not shown. In the semiconductor device 100 of the first embodiment, the major surface 11 of the chip 10 has a predetermined inclination angle $\theta$ to the mount surface, not shown. For this reason, the major surface 11 is so oriented as to allow the magnetic line of force to be directed not only in a horizontal direction but also in a vertical direction to the mount surface. It is, therefore, possible to detect, as shown in FIG. 5, a magnetic line of force, A, coming in a direction parallel to the mount surface As indicated by the characteristic curve in FIG. 6, a relation of the aforementioned inclination angle $\theta$ to a detection output Vh is such that a maximum value Vhm is attained at $\theta=90°$ and a minimum value (that is, zero) at $\theta=0$. It has been found that this relation can be expressed by the following equation:

$$Vh = Vhm \cdot \sin\theta$$

In the semiconductor device 100 of the first embodiment, it is possible to obtain an output of 50% of the maximum value Vhm, for example, at $\theta=30°$.

Figures 1, 2:
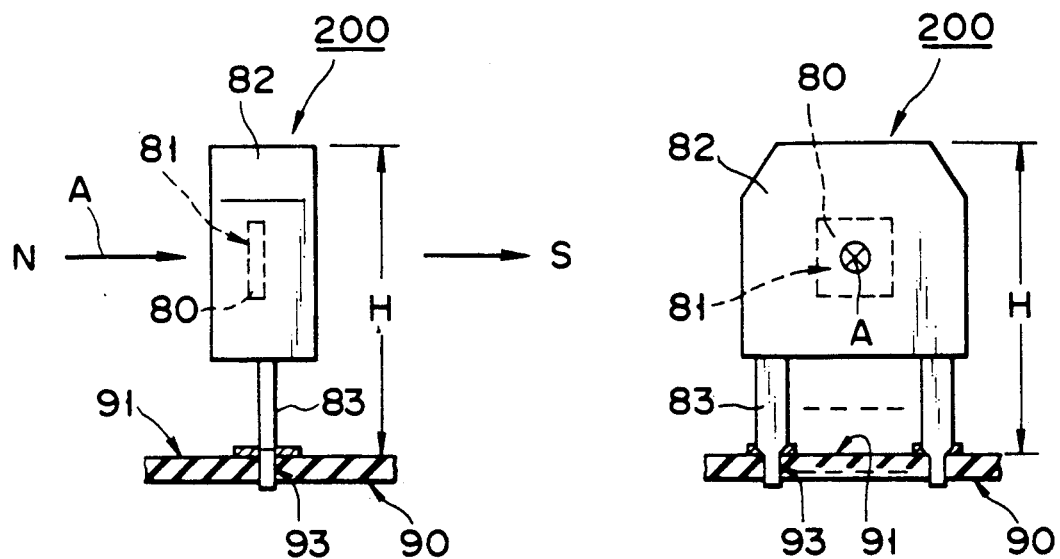
FIGS. 1 and 2, each, are a side view showing a conventional semiconductor device as viewed in a different direction.

The output, in this case, is lowered in comparison with that of the conventional SIP type semiconductor device shown in FIGS. 1 and 2. According to the present semiconductor device, since the major surface of the built-in semiconductor chip is not formed in a direction vertical to the mount surface, the mount thickness corresponding to H in FIGS. 1 and 2 can be made smaller when the package is mounted on the mount substrate. The lowering of the output Vh can be compensated for by, for example, improving the semiconductor chip 10 per se or any other proper means. That is, the semiconductor device of the first embodiment can adequately be employed without decreasing the effects of the present invention.

The characteristic of the present semiconductor device upon the detection of light, not magnetism, can be expressed by a sine function as shown in FIG. 6.

The conventional SIP type semiconductor device shown in FIGS. 1 and 2 cannot detect a magnetic line of force or light coming in a direction vertical to the mount surface, this being a case of $\theta=0$.

In the semiconductor device of the first embodiment, it is possible to detect the magnetic line of force or light coming in a direction vertical to the mounting surface, because the major surface 11 of the chip 10 is so oriented as to have an inclination angle $(90-\theta)$ to the magnetic line of force or light coming from the vertical direction.

The output characteristic of the present semiconductor device with respect to the magnetic line of force or light coming from the direction vertical to the mount surface can be expressed as a sine function as shown in FIG. 6.

FIG. 7 is a diagram showing the state of the light emission of a light emitting element, such as a semiconductor laser, mounted on the chip 10 of the semiconductor device of the first embodiment.

Let it be assumed that, in FIG. 7, a line 30 is parallel to the mount surface, not shown. In the semiconductor device 100 of the first embodiment, the major surface 11 of the semiconductor chip is so oriented as to have an inclination angle $\theta$ to the mount surface. The light E emitting from the semiconductor chip 10 has an inclination angle $\theta$ with respect to the mount surface. By so doing, the emitting light E can be expressed by horizontal and vertical components $\vec{el}$ and $\vec{ev}$ as vectorially given below:

$$\vec{E} = \vec{el} + \vec{ev}$$

Further, at the output of the light $E=VE$, the output Vv of the vertical component $\vec{ev}$ can be expressed by the following sin function:

$$Vv = VE \cdot \sin\theta$$

With a light emitting element-equipped chip 10 built in the semiconductor device 100 of the first embodiment, a light component vertical to the mount surface can be emitted, ensuring a semiconductor device having a smaller mount thickness as opposed to H in FIGS. 1 and 2.

According to the manufacturing method shown in FIGS. 4A to 4C, it is only necessary to exchange a lead frame configuration (including external leads 13A and 13B) to achieve the present invention in comparison with an ordinary manufacturing method. It is possible to utilize a majority of the existing equipment, in particular expensive assembling equipment, without modification. No extra assembling facility is required for the manufacturing of a semiconductor device of the present invention. That is, it is thus possible to readily manufacture a semiconductor device 100 at low cost without using any special equipment.

Embodiment 2

A semiconductor device according to a second embodiment of the present invention will be explained below with respect to FIG. 8 with the same reference numerals employed to designate parts or elements corresponding to those shown in FIG. 3, while different parts or elements will be set out below only.

Figure 8:
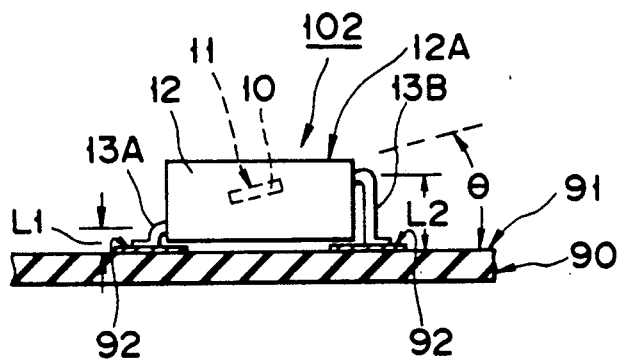
FIG. 8 is a side view showing a semiconductor device according to a second embodiment of the present invention.

As shown in FIG. 8, a semiconductor device 102 of the second embodiment is of such a type that a major surface 11 of a magnetic-line-of-force- or a light-detecting or -emitting element mounted semiconductor chip 10 is sealed in a package 12 in a predetermined inclination angle with respect to an upper surface 12A of the package 12. In this case, the upper surface 12A of the package 12 is situated parallel to a mount surface 91. Given an inclination angle $\theta$ between the major surface 11 of the chip 10 and the upper surface 12A of the package 12, the major surface 11 of the chip 10 is so oriented as to have an inclination angle θ with respect to the mount surface 91.

The semiconductor device 102, like the first embodiment, can detect a magnetic line of force or light coming in a direction parallel to the mount surface 91 or emit a magnetic line of force or light in a direction vertical to the mount surface 91. Since the semiconductor device 102 has its package 12 per se mounted parallel to the mount surface 91 of a mount substrate 90, the mount thickness of the semiconductor device of the first embodiment corresponding to H in FIGS. 1 and 2 can be reduced upon being compared with that of the first embodiment of the present invention. As the upper surface 12A, in particular, of the package is situated parallel to the mount surface 91, the automatic mounting of the semiconductor device as has often been utilized in the case of an SMD can be achieved on the existing automatic mounting equipment. As a result, it is possible to utilize vacuum suction at the upper surface 12A of the package and to readily pick up the semiconductor device 102 per se.

The way of manufacturing a semiconductor device according to the second embodiment of the present invention will be explained below with reference to FIGS. 9A to 9C.

Figure 9A:
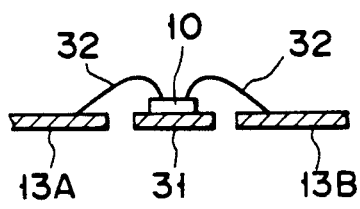
FIGS. 9A to 9C are cross-sectional views showing a sequence of the manufacturing steps of the semiconductor device according to a first embodiment of the present invention.

As shown in FIG. 9A, a semiconductor chip 10 with a built-in element for detecting or emitting a magnetic line of force or light is bonded to a bed 31 on a lead frame as in the step set forth in FIG. 4A—a die-bonding step. Then a bonding pad for instance on the semiconductor chip 10 is electrically connected by external leads 13A and 13B on the lead frame—a wire bonding step.

Figure 9B:
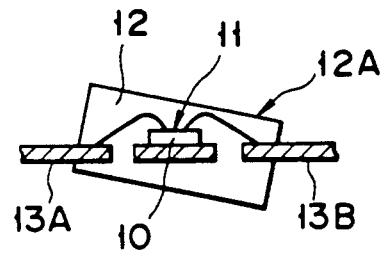

As shown in FIG. 9B, a package 12 which seals, together with wires, the semiconductor chip 10 and parts of external leads 13A and 13B is formed by a mold in the same step as set forth in FIG. 4B. At this time, the semiconductor chip 10 and package 12 is so sealed as to have a predetermined inclination angle between their surfaces 11 and 12A. At this time, the external leads 13A and 13B are projected at different places on each side of the package 12. In order for this to be achieved, use may be made of a package formation mold as shown, for example, in FIG. 10.

Figure 10:
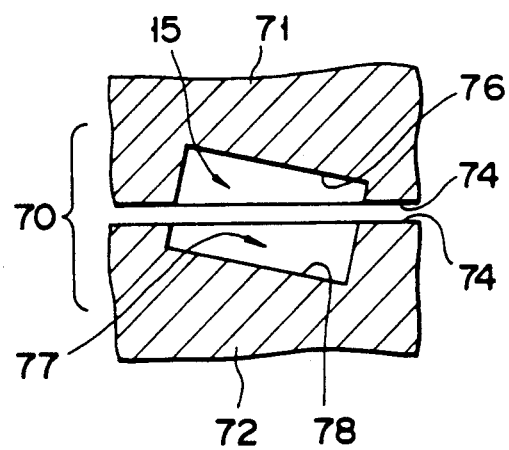
FIG. 10 is a cross-sectional view showing a mold which is used in the manufacture of a semiconductor device according to the second embodiment of the present invention.

FIG. 10 is a cross-sectional view showing part of the package formation mold 70 suited to the manufacture of a semiconductor device of the second embodiment.

As shown in FIG. 10, the mold 70 is composed of a pair of mold halves 71 and 72, upper and lower, with the opposite sides thereof inclined with respect to the mating surfaces of the mold halves to provide two molding cavities 75 and 77 with respect to the upper and lower surfaces corresponding to the top and bottom of the mold in which case the opposite sides of the mold halves are higher for one and lower for the other. By so doing, the bottom surface 76 of the mold cavity 75 of the upper mold half 71 is inclined at a predetermined angle to the mating surface 74 of the mold and the bottom surface 78 of the mold cavity 77 of the lower mold half 72 is inclined at a predetermined angle to the mating surface 74 of the mold.

A semiconductor chip-mounted lead frame is sandwiched between the mutually parallel mating surfaces 74 of the upper and lower mold halves 71 and 72 and insulating resin, such as synthetic resin, is poured into the mold 70 to mold a package 12.

Figure 9C:
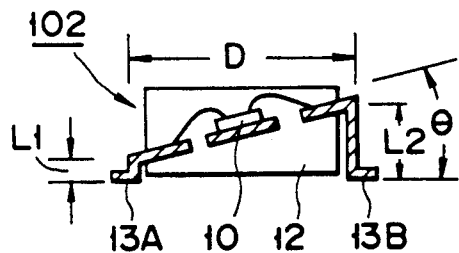

Then, as shown in FIG. 9C, external leads 13A and 13B are each made to have predetermined lengths in the same way as set out above in FIG. 4C and separated away from the lead frame. The external leads 13A and 13B are first bent partway toward the bottom of the package 12 and then bent with their forward end portions oriented outwardly of the package 12. At this time, the external leads 13A and 13B are so formed that their vertical lengths over which the bent sections extend toward the aforementioned bottom (the mount surface) are made different from each other. In an example shown in FIG. 9C, external leads 13A and 13B are made to have lengths L1 and L2, respectively, as given below: L1<L2.

Let it be assumed that, in FIG. 9C, D=1.5 mm and (L2−L1)=0.87 mm where
D: the distance between the external leads 13A and 13B as extending from both the sides of the package 12; and
L1, L2: the vertical lengths of the external leads 13A and 13B.

In this case, the semiconductor chip 10 can be mounted relative to the mount surface of the mount substrate with the major surface 11 inclined at about 30° relative to the mount surface. By so doing, the major surface 11 of the semiconductor chip 10 built in the semiconductor device 102 has an inclination angle of about 30° with respect to the mount surface of the mount substrate.

Even in the aforementioned manufacturing method, the existing assembling equipment can be utilized, as it is, in the same way as explained in connection with FIGS. 4A to 4C. It is thus possible to readily manufacture a semiconductor device at low costs.

Embodiment 3

Figures 11, 12, 13:
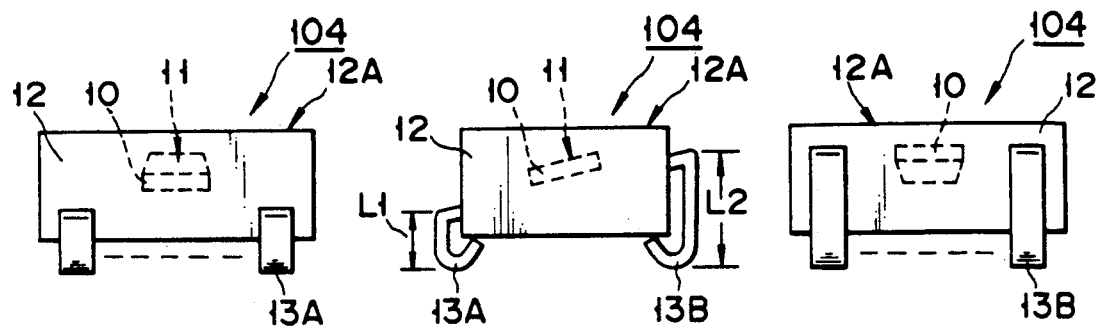
FIGS. 11 to 13, each, are a side view showing a semiconductor device according to a third embodiment of the present invention as viewed in a different direction.
Figure 14:
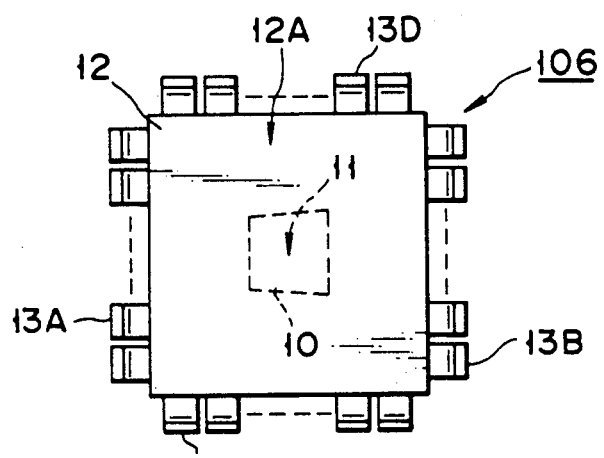
FIG. 14 is a plan view showing a semiconductor device according to a fourth embodiment of the present invention.
Figure 15:
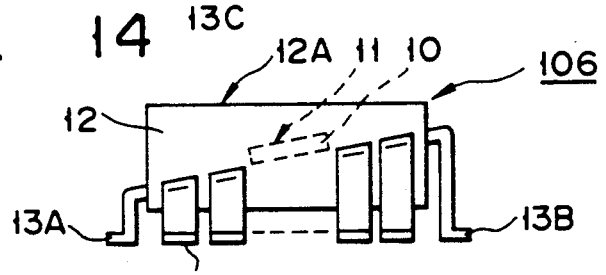
FIGS. 15 to 17, each, are a side view showing a semiconductor device according to a fourth embodiment of the present invention as viewed in a different direction.
Figures 16, 17:
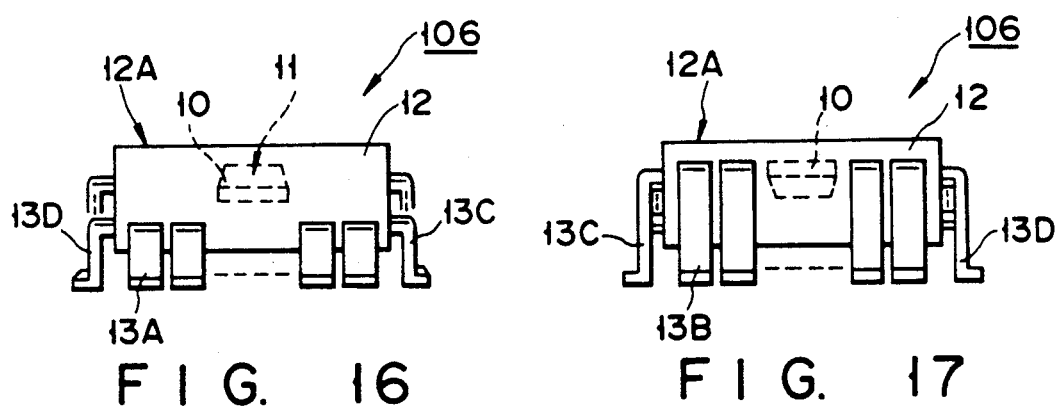

A semiconductor device according to a third embodiment of the present invention will be explained below with reference to FIGS. 11 to 13. In FIGS. 11 to 13, the same reference numerals are employed to designate parts or elements corresponding to those shown in FIG. 3, while different parts or elements will be set forth below.

The semiconductor device 104 of the third embodiment is of such a J-bend type that the forward end portions of the external leads 13A and 13B are J-bent as shown in FIGS. 11 to 13.

Even if the J-bend type is adopted for the external leads 13A and 13B, the vertical lengths of the external leads 13A and 13B extending toward a mount surface, not shown, as defined above are made different from each other. By so doing, the major surface 11 of the semiconductor chip 10 can be made to have a predetermined inclination angle relation to the mount surface, not shown. It is thus possible to obtain the same advantage as set out in connection with the aforementioned embodiment.

Embodiment 4

A semiconductor device according to a fourth embodiment of the present invention will be explained below with reference to FIGS. 14 to 17. In FIGS. 14 to 17, the same reference numerals are employed to designate parts or elements corresponding to those shown in FIG. 3, while different parts or elements will be set out below.

As shown in FIGS. 14 to 17, a semiconductor device 106 of the fourth embodiment of the present invention is of a quad flat package (QFP) having external leads 13A to 13D projected from four sides of a package 12.

If the present invention is applied to the QFP type semiconductor device, external leads 13A and 13B which are projected from the two opposite sides of the package are made, as in the aforementioned first to third embodiments, to have different vertical lengths as defined with respect to a mount surface, not shown.

Further, external leads 13C and 13D which are projected from the other two opposite sides of the package are made to have different vertical lengths as defined with respect to the mount surface, not shown, so that a corresponding inclination angle can be obtained between the major surface 11 and the mount surface, not shown. If a plurality of external leads 13C and that of external leads 13D are provided on the package, their vertical lengths can be made different to meet the aforementioned inclination angle.

If the aforementioned external leads are so provided as set out above, the present invention can be applied to the QFP type semiconductor device, obtaining the same advantages as set forth in connection with the aforementioned embodiments.

Embodiment 5

A semiconductor device according to a fifth embodiment of the present invention will be explained below with respect to FIGS. 18 to 20. In FIGS. 18 to 20, the same reference numerals are employed to designate parts or elements corresponding to those shown in FIG. 3, while different parts or elements will be set out below.

As shown in FIGS. 18 to 20, the semiconductor device 108 of the fifth embodiment is of such a type that external leads 13C and 13D projected from the two opposite sides of a package 12 are made to have different vertical lengths as defined with respect to a mount surface, not shown, so that a predetermined inclination angle is obtained between the major surface 11 of the chip and a mount surface, not shown. If a plurality of external leads 13C and that of external leads 13D are provided on the package, their vertical lengths as defined above are so varied as to meet the aforementioned inclination angle.

Even the aforementioned external leads 13A and 13B can be made to incline the major surface 11 of the chip at a given angle to the mount surface not shown. Further, in the semiconductor device 108 of the fifth embodiment, the external leads 13A and 13B are not located on those sides of the package on which the major surface 11 of the chip is inclined in a direction shown in FIGS. 18 to 20. It is, therefore, possible to reduce an effect of the external lead 13A or 13B when a magnetic line of force or light, for example, is emitted in a direction vertical to the mount surface. It is desirable that an element for emitting a magnetic line of force or light be mounted on the semiconductor chip 10 built in the semiconductor device 108 of the fifth embodiment.

Embodiment 6

A sixth embodiment of the present invention will be explained below with reference to FIGS. 21 to 23. In FIGS. 21 to 23, the same reference numerals are employed to designate parts or elements corresponding to those shown in FIG. 3, while different parts or elements will be set out below.

As shown in FIGS. 21 to 23, the semiconductor device 110 of the sixth embodiment constitutes a combination of the concept of the first embodiment and that of the fifth embodiment. That is, external leads 13E and 13F projected from two opposite sides of a package 12 are made to have different vertical lengths as defined above with respect to a mount surface, not shown, so that the major surface 11 of the semiconductor chip 10 is so varied as to meet a predetermined inclination angle defined between the major surface 11 of the semiconductor chip 10 and the mount surface.

In the arrangement shown in FIGS. 21 to 23, the major surface 11 of the semiconductor chip can be inclined on those sides of the package on which the external leads 13E and 13F are projected in a direction shown in FIGS. 21 to 22. The major surface 11 of the chip can also be inclined in the other direction in which the external leads 13E and 13F are projected as shown in FIGS. 21 to 23. By so doing, the major surface 11 of the chip is inclined both in a first direction first-mentioned and in a second direction vertical to the first direction. Thus, the semiconductor device 110 of the sixth embodiment can detect a magnetic line of force or light coming in the direction (first direction) parallel to the mount surface, not shown, and in the direction (second direction) vertical to a plan of the first direction.

Embodiment 7

The way of surface-mounting an SMD according to the seventh embodiment of the present invention on the mount substrate of an electronic device will be explained below with reference to FIG. 24.

FIG. 24 is a cross-sectional view showing a 3-layered device having three semiconductor circuit substrates with an SMD surface-mounted thereon each. The same reference numerals are employed in FIG. 24 to designate parts or elements corresponding to those shown in the preceding drawings.

As shown in FIG. 24, three mount substrates 90 are provided on the three-layered device and each mount substrate 90 has a mount surface 91 each. Of the three mount substrates 90, one mount substrate can be used to mount semiconductor devices on each surface of the mount substrate. For this reason, a second mount surface 91A exists on the rear side of the mount surface 91. A conductive film pattern 92 for constituting a desired circuit pattern is formed on the mount surfaces 91 and 92A. Semiconductor devices 102, 108 and 202 are mounted on the conductive film pattern 92 through which a supply of a drive voltage as well as a supply of an electrical signal to and from an associated circuit is carried out. The semiconductor device 102 is of the same type as set out in connection with the second embodiment and a light detecting element, such as a photodiode, is mounted on a semiconductor chip 10 built in the semiconductor device. By so doing, the semiconductor device 102 detects light E. The semiconductor device 108 is of the same type as set out in connection with the fifth embodiment and a light emitting element, such as a semiconductor laser, is mounted on the semiconductor chip 10 built in the present semiconductor device. Therefore, the semiconductor device 108 can emit light and the semiconductor device 202 is of an ordinary type with an element, such as a MOSFET or a bipolar transistor, mounted on a built-in semiconductor chip 10 and performs various functions necessary for a circuit or circuits, such as a logical operation and signal control.

Incorporating the semiconductor devices of the present invention into the aforementioned layered circuit substrate structure ensures the following advantages.

First, the mount thickness as defined in connection with the embodiments of the present invention becomes smaller by mounting the semiconductor device 102 on a given location to detect light E coming in a direction parallel to the mount surfaces 91 and 91A. The layered circuit substrate structure allows light E to be detected at the intermediate layer in particular. Further, the semiconductor device 102, like the ordinary semiconductor device 202, can automatically be arranged and mounted on the mount surface by utilizing an automatic mount technique.

The mount thickness as defined in connection with the aforementioned embodiment becomes smaller by mounting the semiconductor device 108 on the mount surface to emit light E in a direction vertical to the mount surface 91A. Mounting the semiconductor device 102 at a proper location on the mount surface to receive light E emitted by the semiconductor device 108 can ensure the effective reception of light E. The semiconductor device 108, like the ordinary semiconductor device 202, can automatically be arranged and mounted by utilizing the automatic mount technique.

By applying the aforementioned surface mount technique to the semiconductor device of the present invention it is not necessary to use the semiconductor device of, for example, FIG. 1 and 2 at a location to receive a magnetic line of force or light coming in a direction parallel to the mount surface. The aforementioned semiconductor structure can avoid the joint use of the SMD and pin-insertion type device and achieve a smaller mount thickness as defined above and can readily be achieved as a labor-saving and hence a low-cost unit.

It is to be noted that, in the arrangement shown in FIG. 24, a magnetic line of force can be used in place of the light E.

Embodiment 8

A semiconductor device according to an eighth embodiment of the present invention will be explained below with reference to FIGS. 25 to 27. In FIGS. 25 to 27, the same reference numerals are employed to designate parts or elements corresponding to those shown in FIG. 3, while different parts or elements will be set out below.

The semiconductor device according to the eighth embodiment of the present invention is of a pin-insertion type DIP semiconductor device. External leads 53A and 53B have a narrower forward end portion each which is inserted into a corresponding socket hole provided in the mount substrate, not shown.

In this way, it may be possible to apply the present invention to the DIP type semiconductor device.

The concept of inclining the major surface 11 of the built-in semiconductor chip 10 at a give angle to the mount surface, not shown, may be adopted for the aforementioned embodiments.

Embodiment 9

A semiconductor device according to a ninth embodiment of the present invention will be explained below with reference to FIGS. 28 and 29. In FIGS. 28 and 29, the same reference numerals are employed to designate parts or elements corresponding to those shown in FIG. 3, while different parts or elements as will be set forth below.

As shown in FIGS. 28 and 29, the present invention is applied to a pin-insertion type SIP semiconductor device to provide the semiconductor device 152 of the ninth embodiment. External leads 53 are bent partway so that a major surface 11 of a semiconductor chip 10 has an inclination angle relative to a mount surface, not shown.

In the aforementioned semiconductor device thus constructed, the mount thickness as defined in connection with the preceding embodiment becomes smaller than that of the SIP type semiconductor device shown in FIGS. 1 and 2 in particular. It is thus possible to detect, for example, light coming in a direction vertical to the mount surface which would otherwise be impossible on the SIP type semiconductor device shown in FIGS. 1 and 2.

In this way, the present invention can be applied to the SIP type semiconductor device.

Embodiment 10

A semiconductor device according to a tenth embodiment of the present invention will be explained below with reference to FIGS. 30 and 31 with the same reference numerals employed to designate parts or elements corresponding to those shown in FIG. 3.

As shown in FIGS. 30 and 31, the present invention is applied to the pin-insertion type SIP semiconductor device to provide a semiconductor device 154 of the tenth embodiment of the present intention with the top surface of a package 12 formed in a direction parallel to, for example, a mount surface, not shown. The external lead 53 is bent partway to have a predetermined inclination angle to the mount surface, not shown.

In the aforementioned semiconductor device 154, the mount thickness as defined above in connection with the preceding embodiment becomes much smaller than the SIP semiconductor device of the ninth embodiment.

Further, the package 12 can be readily manufactured using the package formation mold of, for example, FIG. 10 with a minor modification made thereto.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor chip having a major surface;

an active element formed on the major surface of said semiconductor chip, for detecting at least one of a magnetic line of force and light;

a package for housing said semiconductor chip, said package having an upper surface facing the major surface of said semiconductor chip, a lower surface opposing the upper surface, and a plurality of sides connecting the upper and lower surfaces;

a first lead having first and second portions terminating respectfully at first and second ends, the first portion of said first lead being guided from a first side of said plurality of sides into said package, the first end of said first lead being electrically connected to said semiconductor chip, and the second portion of said first lead extending along the first side and being bent toward the lower surface of said package;

a second lead having first and second portions terminating respectfully at first and second ends, the first portion of said second lead being guided from a second side of said plurality of sides opposing the first side into said package, the first end of said second lead being electrically connected to said semiconductor chip, and the second portion of said second lead extending along the second side and being bent toward the lower surface of said package; and wherein the length of said second lead between the position at which said second lead is bent and the second end of said second lead is different from the length of said first lead between the position at which said first lead is bent and the second end of said first lead, and wherein the active element is inclined with respect to a line defined by the second ends of said first and second leads.

2. A semiconductor device comprising:
a semiconductor chip having a major surface;
an active element formed on the major surface of said semiconductor chip, for emitting at least one of a magnetic line of force and light;
a package for housing said semiconductor chip, said package having an upper surface facing the major surface of said semiconductor chip, a lower surface opposing the upper surface, and a plurality of sides connecting the upper and lower surfaces;
a first lead having first and second portions terminating respectfully at first and second ends, the first portion of said first lead being guided from a first side of said plurality of sides into said package, the first end of said first lead being electrically connected to said semiconductor chip, and the second portion of said first lead extending along the first side and being bent toward the lower surface of said package;
a second lead having first and second portions terminating respectfully at first and second ends, the first portion of said second lead being guided from a second side of said plurality of sides opposing the first side into said package, the first end of said second lead being electrically connected to said semiconductor chip, and the second portion of said second lead extending along the second side and being bent toward the lower surface of said package; and
wherein the length of said second lead between the position at which said second lead is bent and the second end of said second lead is different from the length of said first lead between the position at which said first lead is bent and the second end of said first lead, and wherein said active element is inclined with respect to a line defined by the second ends of said first and second leads.

3. The semiconductor device according to claim 1, wherein the major surface of said semiconductor chip is parallel to the upper surface of said package.

4. The semiconductor device according to claim 2, wherein the major surface of said semiconductor chip is parallel to the upper surface of said package.

5. The semiconductor device according to claim 1, wherein the major surface of said semiconductor chip is inclined at a predetermined angle with the upper surface of said package.

6. The semiconductor device according to claim 2 wherein the major surface of said semiconductor chip is inclined at a predetermined angle with the upper surface of said package.

7. A semiconductor device comprising:
a semiconductor chip having a major surface;
an active element formed on the major surface of said semiconductor chip, for detecting at least one of a magnetic line of force and light;
a package for housing said semiconductor chip, said package having an upper surface facing the major surface of said semiconductor chip, a lower surface opposing the upper surface, and a plurality of sides connecting the upper and lower surfaces;
first and second leads each having first and second portions terminating respectfully at first and second ends, the first portions of said first and second leads being guided from a first side of said plurality of sides into said package, the first ends of said first and second leads being electrically connected to said semiconductor chip, the second portions of said first and second leads extending along the first side and being bent toward the lower surface of said package, and the lengths of said first and second leads between the positions at which said first and second leads are bent and the second ends of said first and second leads being different from each other; and
third and fourth leads each having first and second portions terminating respectfully at first and second ends, the first portions of said third and fourth leads being guided from a second side of said plurality of sides opposing the first side into said package, the first ends of said third and fourth leads being electrically connected to said semiconductor chip, and the second portions of said third and fourth leads extending along the second side and being bent toward the lower surface of said package, and the lengths of said third and fourth leads between the positions at which said third and fourth leads are bent and the second ends of the third and fourth leads being different from each other, and wherein said active element is inclined with respect to a plane defined by the second ends of said first, second and third leads.

8. A semiconductor device comprising:
a semiconductor chip having a major surface;
an active element formed on the major surface of said semiconductor chip, for emitting at least one of a magnetic line of force and light;
a package for housing said semiconductor chip, said package having an upper surface facing the major surface of said semiconductor chip, a lower surface opposing the upper surface, and a plurality of sides connecting the upper and lower surfaces;
first and second leads each having first and second portions terminating respectfully at first and second ends, the first portions of said first and second leads being guided from a first side of said plurality of sides into said package, the first ends of said first and second leads being electrically connected to said semiconductor chip, the second portions of said first and second leads extending along the first side and being bent toward the lower surface of said package, and the lengths of said first and second leads between the positions at which said first and second leads being different from each other; and
third and fourth leads each having first and second portions terminating respectfully at first and second ends, the first portions of said third and fourth leads being guided from a second side of said plurality of sides opposing the first side into said package, the first ends of said third and fourth leads being electrically connected to said semiconductor chip, and the second portions of said third and fourth leads extending along the second side and being bent toward the lower surface of said package, and the lengths of said third and fourth leads between the positions at which said third and fourth leads are bent and the second ends of the third and fourth leads being different from each other, and wherein said active element is inclined with respect to a plane defined by the second ends of said first, second and third leads.

9. The semiconductor device according to claim 7, wherein said semiconductor device is of a surface mount type device.

10. The semiconductor device according to claim 8, wherein the semiconductor device is of a surface mount type device.

* * * * *

UNITED STATES PATENT AND TRADEMARK OFFICE
CERTIFICATE OF CORRECTION

PATENT NO. : 5,025,305
DATED : June 18, 1991
INVENTOR(S) : Yutaka TOMISAWA et al.

It is certified that error appears in the above-identified patent and that said Letters Patent is hereby corrected as shown below:

Claim 1, column 13, line 3, before "active" change "the" to --said--.

Claim 6, column 13, line 53, after "2" insert --,--.

Claim 8, column 14, line 52, before "being" insert --are bent and the second ends of said first and second leads--.

Signed and Sealed this

Third Day of August, 1993

Attest:

MICHAEL K. KIRK

Attesting Officer

Acting Commissioner of Patents and Trademarks